(12) United States Patent
Chen et al.

(10) Patent No.: US 6,821,843 B1
(45) Date of Patent: Nov. 23, 2004

(54) FABRICATION METHOD FOR AN ARRAY AREA AND A SUPPORT AREA OF A DYNAMIC RANDOM ACCESS MEMORY

(75) Inventors: Sheng-Tsong Chen, Tainan (TW); Shian-Jyh Lin, Chiayi Hsien (TW); Ming-Cheng Chang, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/847,562

(22) Filed: May 17, 2004

(30) Foreign Application Priority Data

Aug. 13, 2003 (TW) ........................................ 92122203 A

(51) Int. Cl.$^7$ ........................................... H01L 21/8242
(52) U.S. Cl. .......................... 438/243; 438/244; 438/248
(58) Field of Search .................................. 438/243–252, 438/386–392

(56) References Cited

U.S. PATENT DOCUMENTS 5,665,624 A * 9/1997 Hong ........................ 438/244

* cited by examiner

*Primary Examiner*—H. Jey Tsai
(74) *Attorney, Agent, or Firm*—Quintero Law Office

(57) ABSTRACT

A fabrication method for a DRAM cell with dual driving voltages and a vertical transistor. Liquid phase deposition (LPD) is used to integrate an array area process and a support area process in order to simplify steps.

13 Claims, 10 Drawing Sheets

FABRICATION METHOD FOR AN ARRAY AREA AND A SUPPORT AREA OF A DYNAMIC RANDOM ACCESS MEMORY

BACKGROUND OF THE INVENTION

1. Field of the Invention

The invention relates to a fabrication method for a dynamic random access memory (DRAM), and more particularly to a fabrication method for an array area and a support area of a DRAM cell.

2. Description of the Related Art

A DRAM cell comprises memory elements in an array area and support circuit devices in a support area, in which the support circuit devices are used to control address and data transport of the memory elements. In order to reduce the size of individual DRAM cells and increase their density, three dimensional structures have been developed in the DRAM cell, such as a vertical transistor and a deep trench capacitor, which result in smaller memory area and higher operating speed. However, conventional processes for a gate dielectric layer and a gate conductive layer in the support area are combined with processes for word lines in the array area, thus the procedure is complicated and requires numbers of photolithography steps, resulting in reduced accuracy in transferring patterns.

FIGS. 1A to 1I are cross-sections of a conventional fabrication method for an array area and a support area of a DRAM cell.

In FIG. 1A, a semiconductor silicon substrate 10 comprises an array area I and a support area II. A first shallow trench isolation (STI) structure 12 is formed within the array area I for separating memory elements from each other, and a second STI structure 14 is formed in a transition region between the array area I and the support area II for separating elements of the array area I from elements of the support area II. A pad oxide layer 16 and a pad nitride layer 18 are patterned on the substrate 10 to define a deep trench DT within the array area I. A deep trench capacitor 20 is formed at the lower portion of the deep trench DT, a vertical transistor 24 is formed at the upper portion of the deep trench DT, and an oxide isolating layer 22 is sandwiched between the deep trench capacitor 20 and the vertical transistor 24. The vertical transistor 24 comprises a gate oxide layer 26 and a gate electrode layer 28. Conventionally, after completing the STI structures 12 and 14, chemical mechanical polishing (CMP) is employed to level off the surfaces of the gate electrode layer 28, the STI structures 12 and 14, and the pad nitride layer 18.

In FIG. 1B, a nitride liner 30 and an oxide cap layer 32 are successively deposited on the substrate 10, and then the oxide cap layer 32 is removed away from the array area I by using a mask with exposure and wet etching.

Next, in FIG. 1C, the pad nitride layer 18 exposed on the array area I is removed, and then a surface reoxidation process is performed thereon. In order to repair a profile loss at the top corner of the gate electrode layer 28 to prevent current leakage therein, a nitride spacer 34 is formed on the top sidewalls of the gate electrode layer 28, the first STI structure 12 and the second STI structure 14 within the array area I by deposition, photolithography and dry etching. Afterward, an ion implantation process is performed on the array area I.

Next, in FIG. 1D, a top oxide layer 36 and an anti-reflective coating (ARC) layer 38 are successively deposited on the substrate.

Next, in FIG. 1E, a reactive ion etching (RIE) process is employed to etch back the ARC layer 38 until the top surface of the top oxide layer 36 is leveled off with the top surfaces of the gate electrode layer 28 and the first STI structure 12.

Next, in FIG. 1F, a polysilicon cap layer 38 is patterned on the array area I, and then employed as a mask to remove the nitride liner 30 and the pad nitride layer 18 away from the support area II. Thereafter, a reoxidation process and an ion implantation process are performed on the support area II.

Then, in FIG. 1G, a gate dielectric layer 40 and a first gate polysilicon layer 42 are successively deposited on the substrate 10.

Next, in FIG. 1H, a mask, photolithography and etching are used to remove the first gate polysilicon layer 42 and the gate dielectric layer 40 away from the array area I until the gate electrode layer 28 of the vertical transistor 24 is exposed.

Finally, in FIG. 1I, a second gate polysilicon layer 44 is patterned on the array area I, thus two gate structures can be defined on the array area I and the support area II, respectively, in subsequent processes.

However, the conventional method has disadvantages described below. First, before the formation of the top oxide layer 36, the nitride liner 30 and the oxide cap layer 32 are existed on the support area II and the pad nitride layer 18 is removed from the array area I, thus the deposition profile of the top oxide layer 36 presents apparent rise and fall which degrades its planarization result in the subsequent CMP process. Second, since the pad nitride layer 18 is removed from the array area I and the support area II through different steps, extra photolithography and etching processes requiring numbers of masks and excessive photoresist material result in processing difficulties. Third, the polysilicon cap layer 38 is mainly employed to cover the array area I, and then the gate dielectric layer 40, the first gate polysilicon layer 42 and the polysilicon cap layer 38 must be removed from the array area I, thus increasing process difficulty and production cost.

SUMMARY OF THE INVENTION

The present invention is a fabrication method for a DRAM cell with dual driving voltages and a vertical transistor. More particularly, the fabrication method uses liquid phase deposition (LPD) to integrate an array area process and a support area process in order to simplify steps.

Accordingly, the present invention provides a fabrication method for an array area and a support area of a DRAM cell, including the following steps. A semiconductor silicon substrate is provided with an array area and a support area. Then, a first pad layer and a second pad layer are formed overlying the semiconductor silicon substrate. Next, at least one deep trench is formed in the semiconductor silicon substrate within the array area. A vertical transistor is formed overlying the upper portion of the deep trench, in which the vertical transistor comprises a gate electrode layer. Next, a planarization process is performed to level off the gate electrode layer with the second pad layer. After removing the second pad layer and the first pad layer, a gate dielectric layer is formed overlying the semiconductor silicon substrate. Next, a first gate conductive layer is formed overlying the gate dielectric layer within the support area. Next, a photoresist layer is formed overlying the support area to cover the top and sidewall of the first gate conductive layer. Next, a liquid phase deposition process is performed to deposit a top isolating layer outside the photoresist layer, in which the top isolating layer is formed overlying the gate dielectric layer within the array area. After forming an anti-reflective coating layer on the top isolating layer and the photoresist layer, parts of the anti-reflective coating layer and the top isolating layer are removed until the top isolating layer is leveled with the gate electrode layer. Finally, the photoresist layer is removed.

DESCRIPTION OF THE DRAWINGS

For a better understanding of the present invention, reference is made to a detailed description to be read in conjunction with the accompanying drawings.

DETAILED DESCRIPTION OF THE INVENTION

The present invention provides a fabrication method for a DRAM cell with dual driving voltages and a vertical transistor. More particularly, the fabrication method uses liquid phase deposition (LPD) to integrate an array area process and a support area process in order to simplify steps.

FIGS. 2A to 2I are cross-sections of a fabrication method for an array area and a support area of a DRAM cell.

Figure 1A:
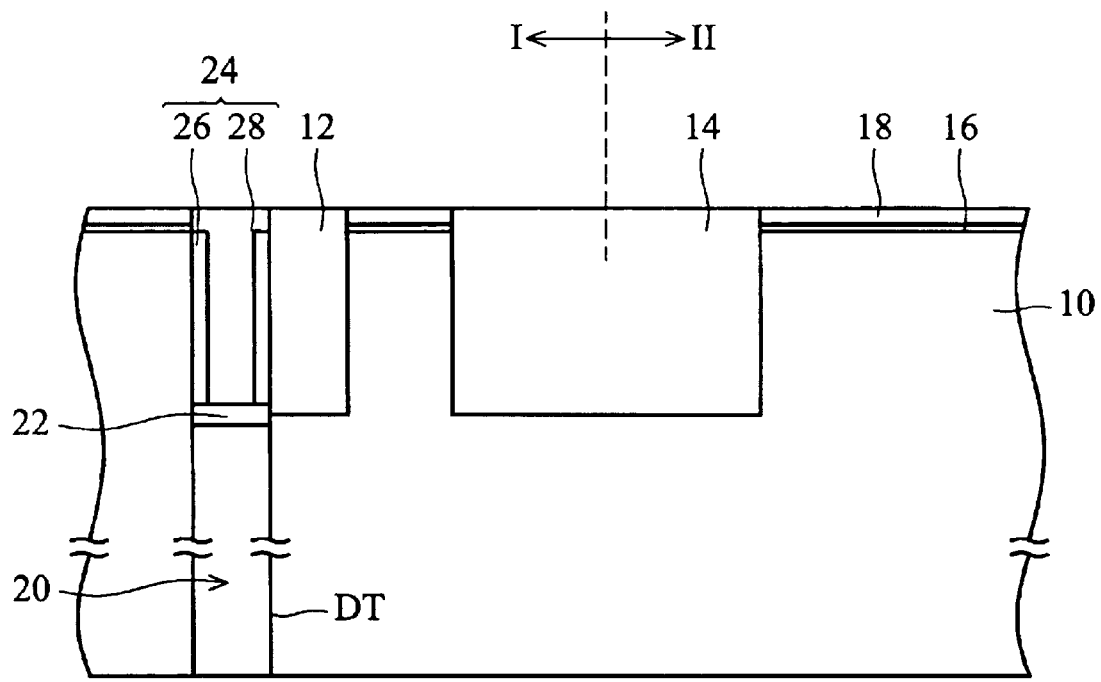
FIGS. 1A to 1I are cross-sections of a conventional fabrication method for an array area and a support area of a DRAM cell.
Figure 1B:
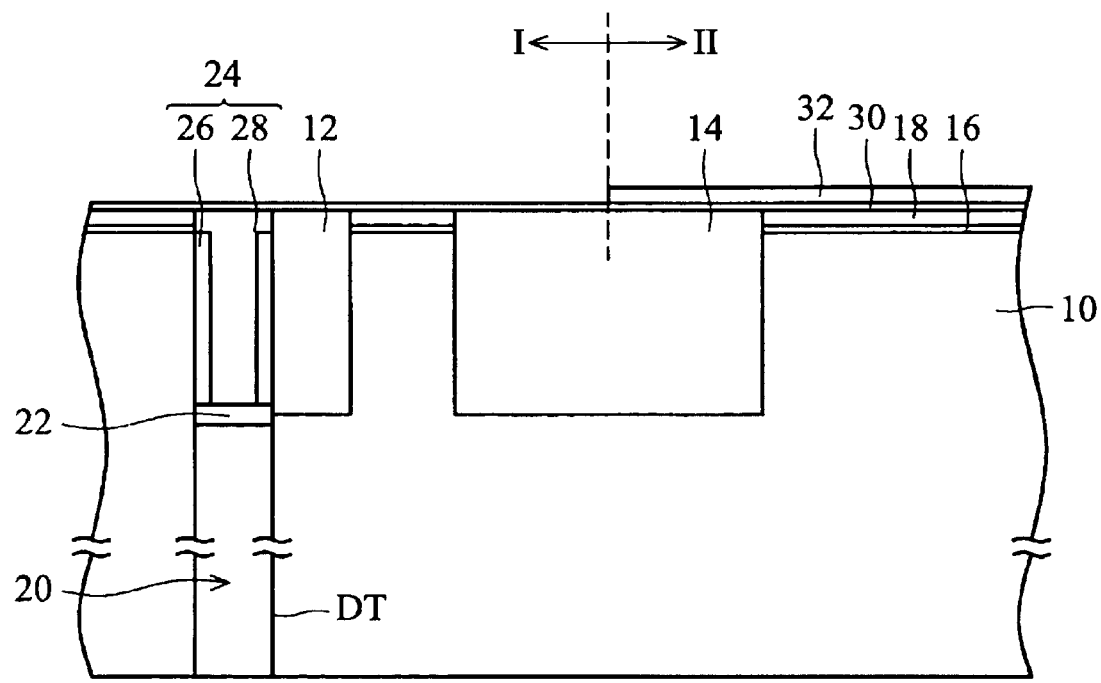
Figure 1C:
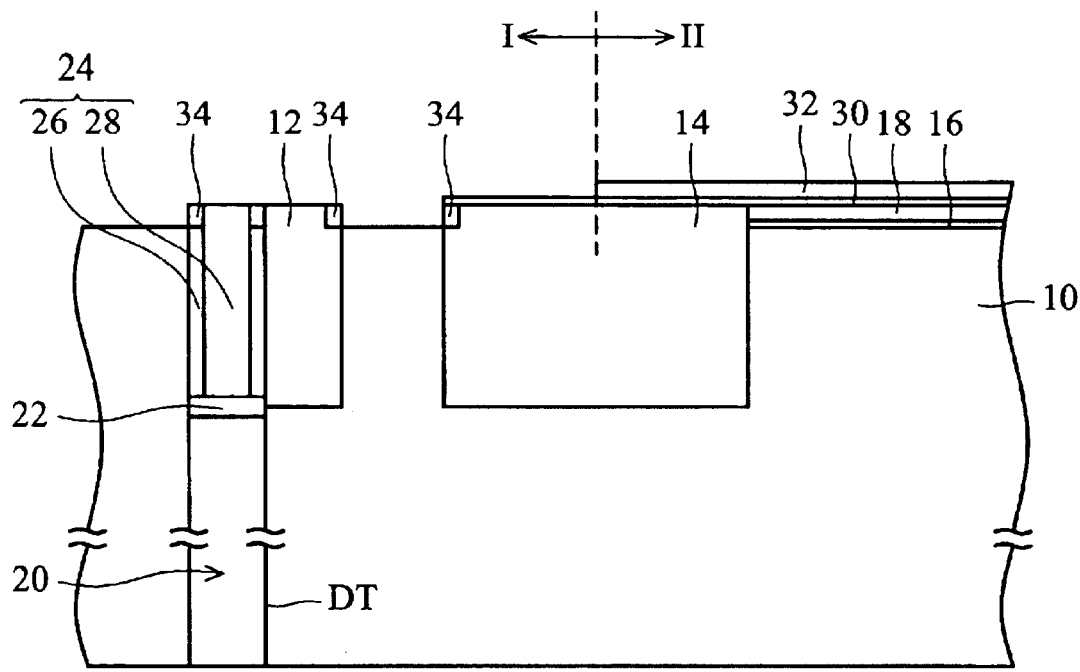
Figure 1D:
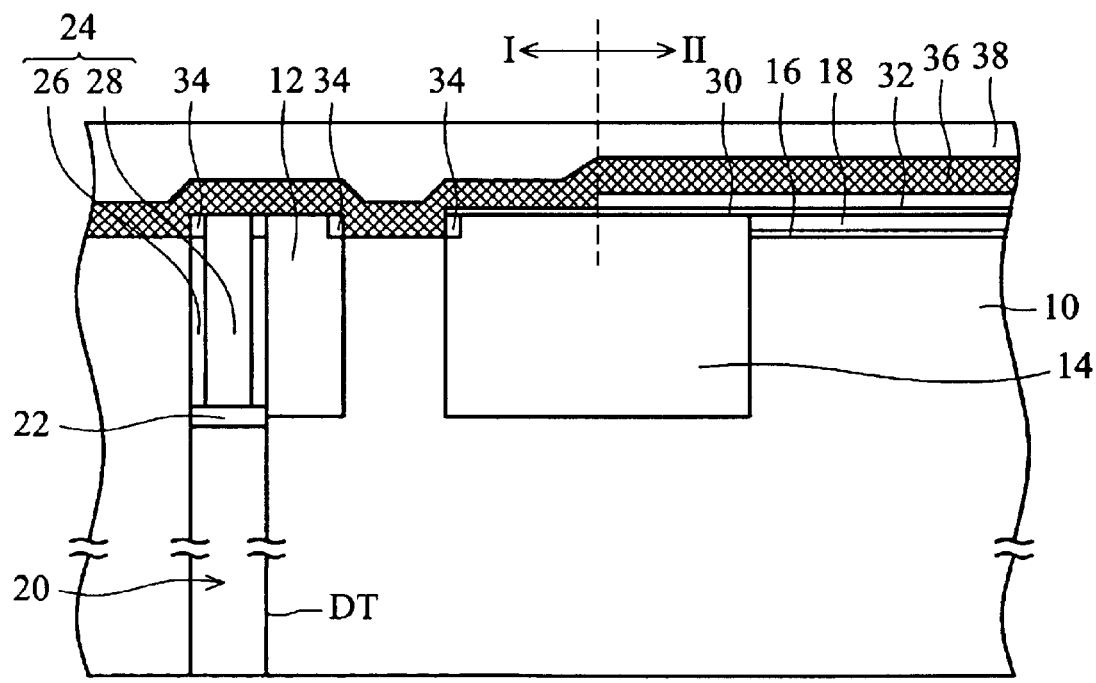
Figure 1E:
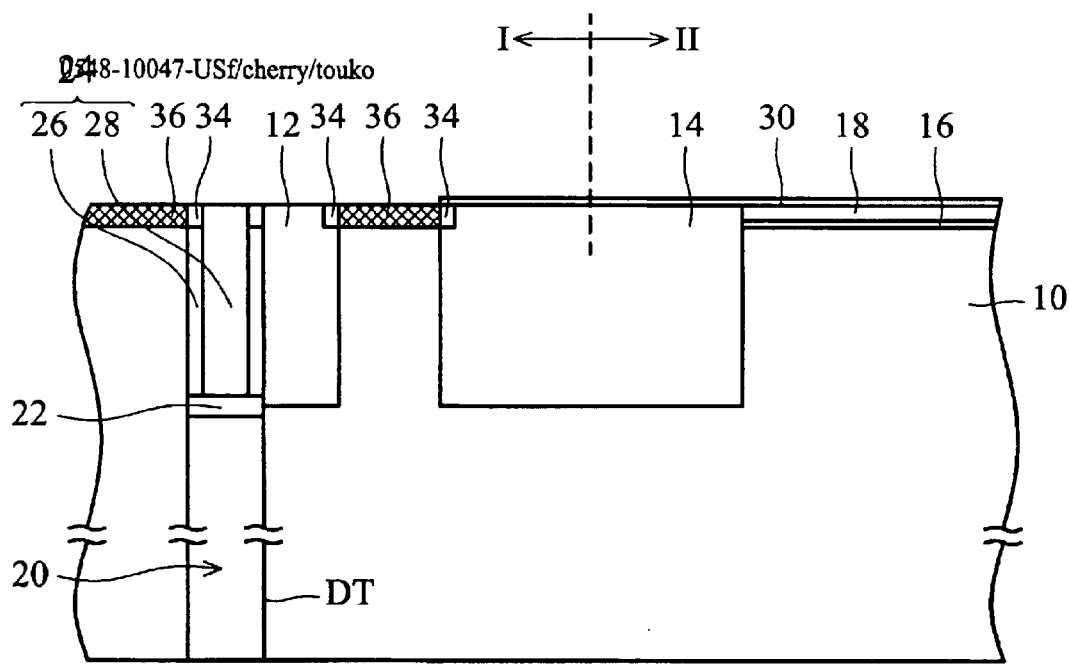
Figure 1F:
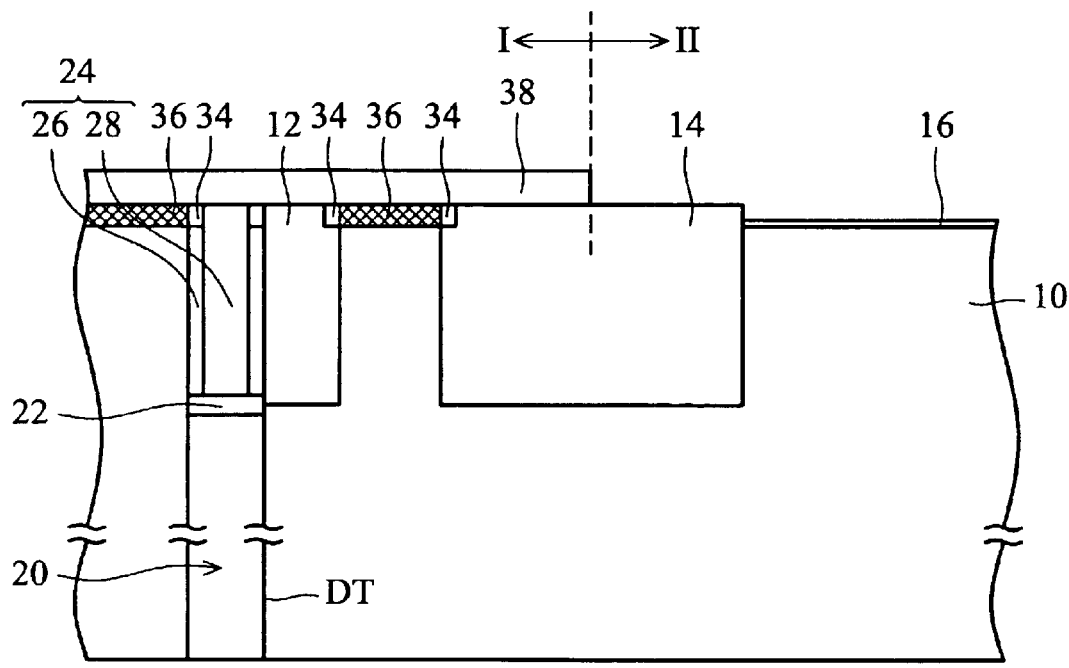
Figure 1G:
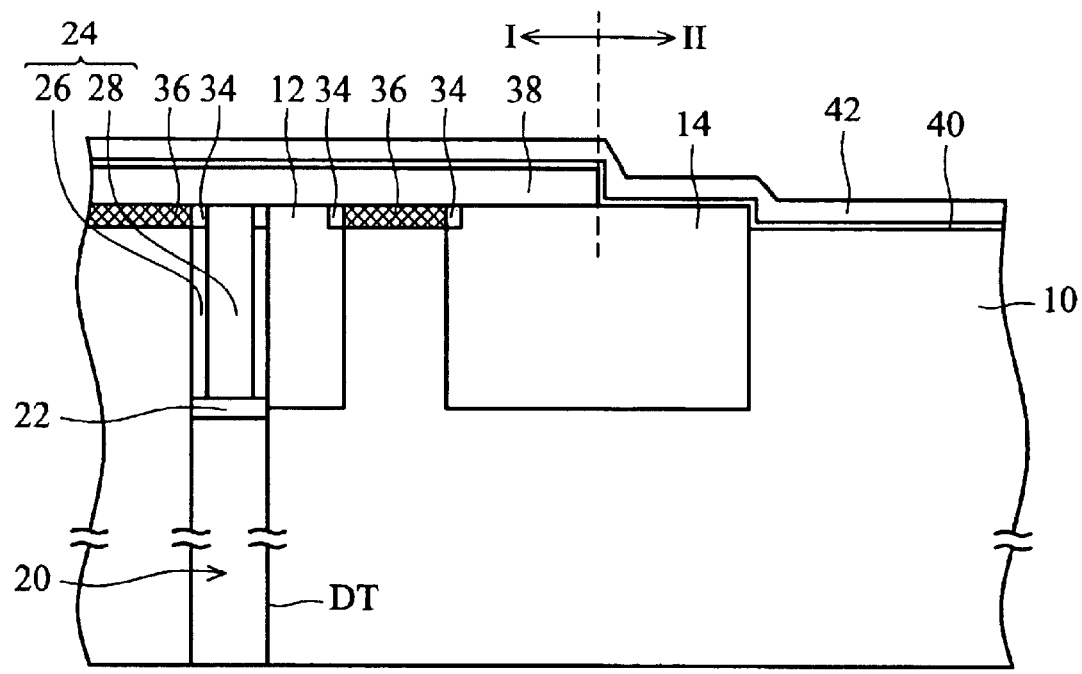
Figure 1H:
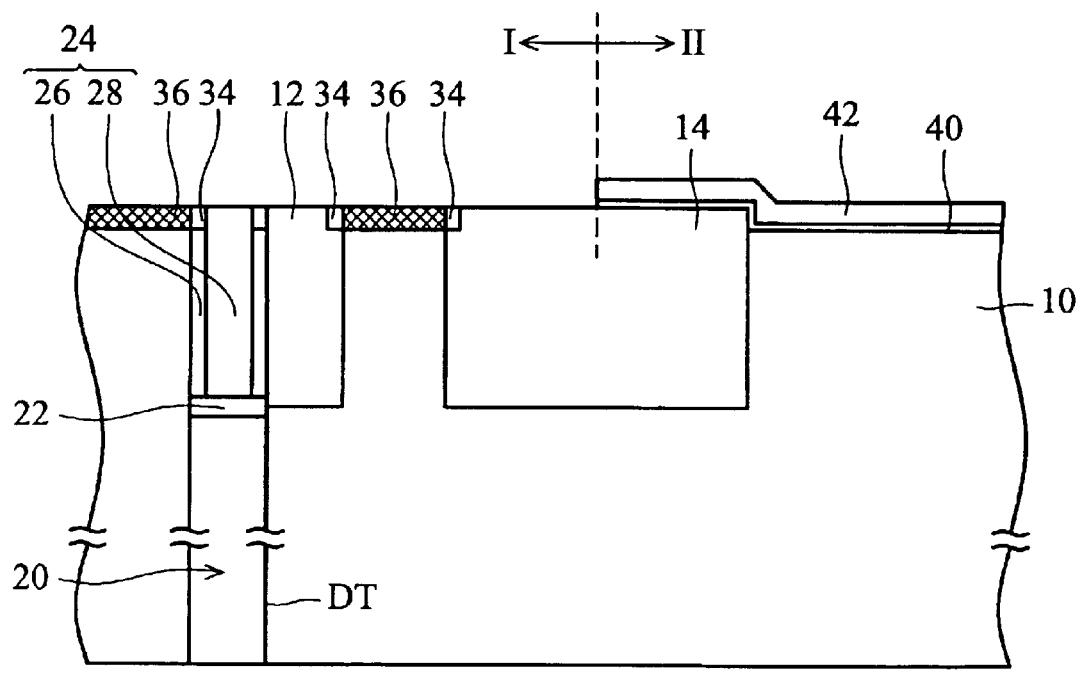
Figure 1I:
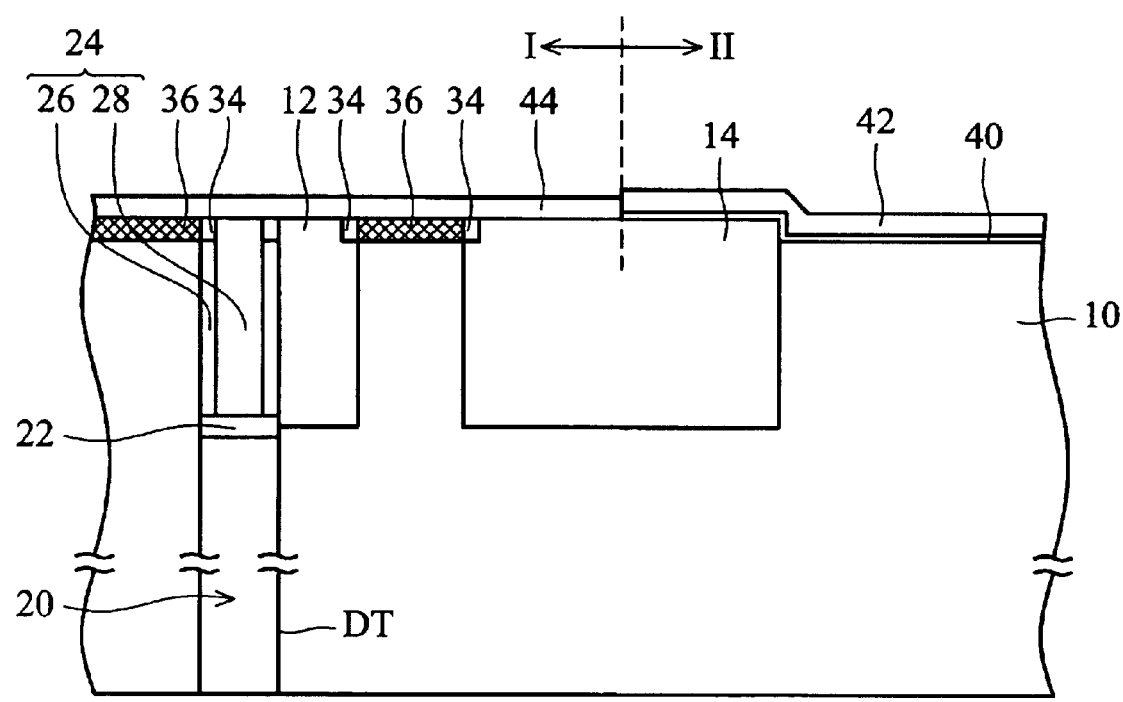
Figure 2A:
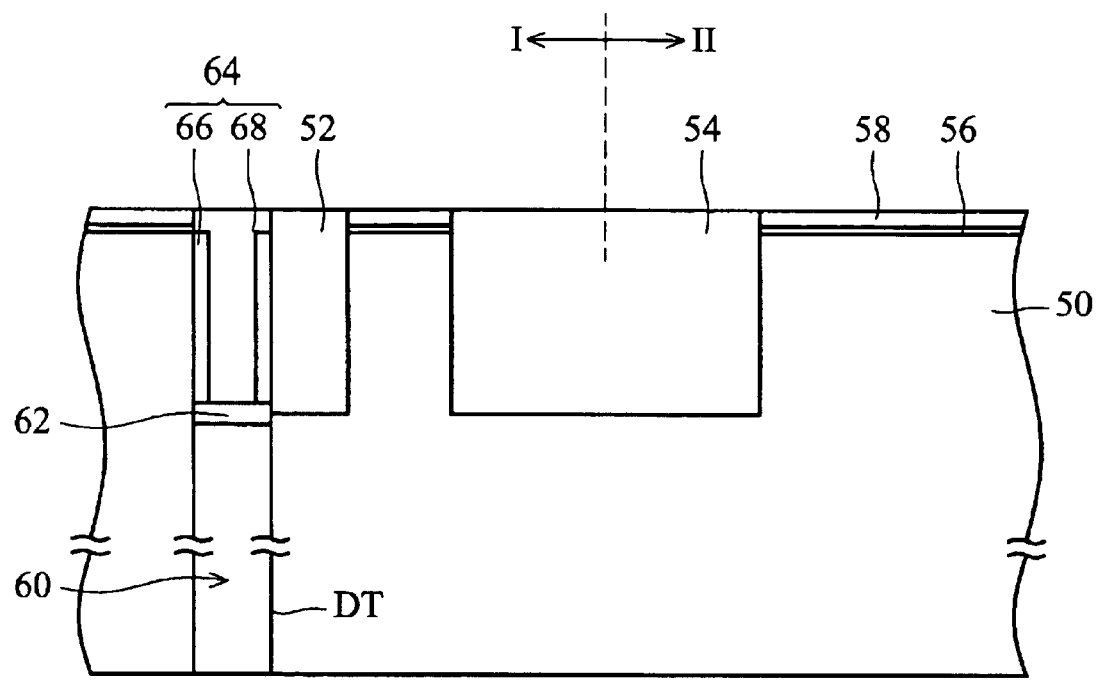
FIGS. 2A to 2I are cross-sections of a fabrication method for an array area and a support area of a DRAM cell.

In FIG. 2A, a semiconductor silicon substrate 50 comprises an array area I and a support area II. A first shallow trench isolation (STI) structure 52 is formed within the array area I for separating memory elements from each other, and a second STI structure 54 is formed in a transition region between the array area I and the support area II for separating elements of the array area I from elements of the support area II. A first pad layer 56 and a second pad layer 58 are patterned on the substrate 50 to define a deep trench DT within the array area I. A deep trench capacitor 60 is formed at the lower portion of the deep trench DT, a vertical transistor 64 is formed at the upper portion of the deep trench DT, and an isolating layer 62 is sandwiched between the deep trench capacitor 60 and the vertical transistor 64. The vertical transistor 64 comprises a gate dielectric layer 66 and a gate electrode layer 68.

Preferably, the STI structures 52 and 54 are silicon oxide structures, the first pad layer 56 is a silicon oxide layer, the second pad layer 58 is a silicon nitride layer, and the isolating layer 62 is a silicon oxide layer. In a case of using a p-type semiconductor silicon substrate 50, the deep trench capacitor 60 preferably comprises an n$^+$-type diffusion region, an ONO dielectric layer and an n$^+$-doped polysilicon layer. The gate dielectric layer 66 is a silicon oxide layer grown on two sidewalls of the upper portion of the deep trench DT. The gate electrode layer 68 is an n$^+$-doped polysilicon layer.

Structural features of the deep trench capacitor 60 and the vertical transistor 64 and fabrication methods thereof are not substantially related to main characteristics of the present invention, and may be appropriately modified in accordance with product design, thus not limited herein. Generally, after completing the STI structures 52 and 54, chemical mechanical polishing (CMP) is employed to level off the surfaces of the gate electrode layer 68, the STI structures 52 and 54, and the second pad layer 58.

Figure 2B:
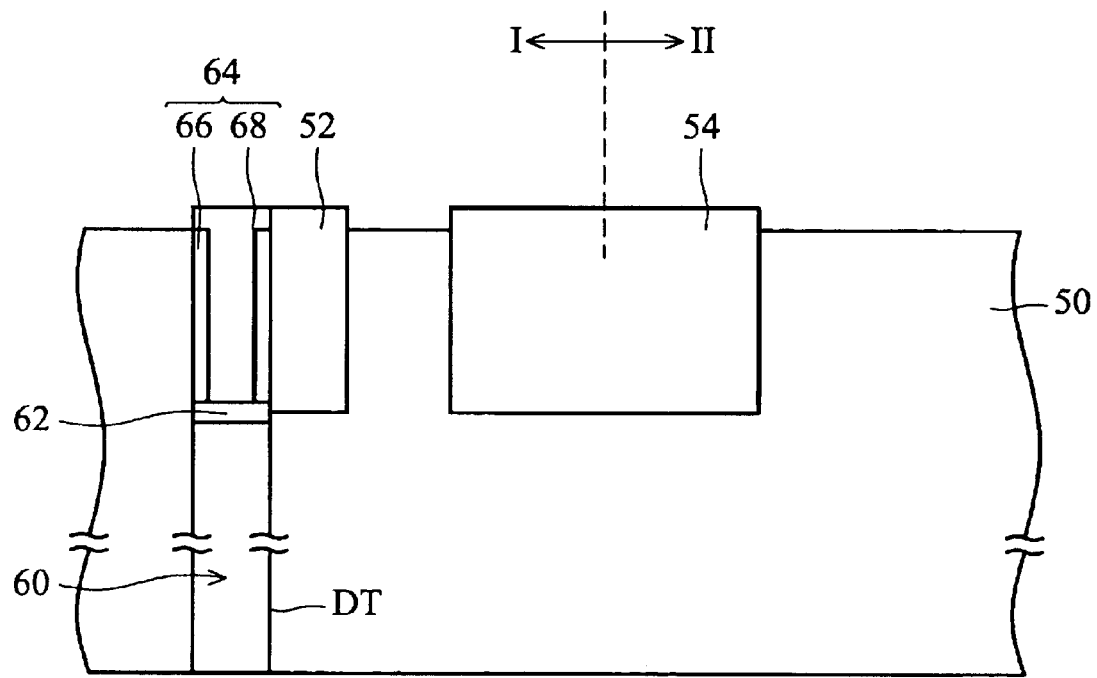
Figure 2C:
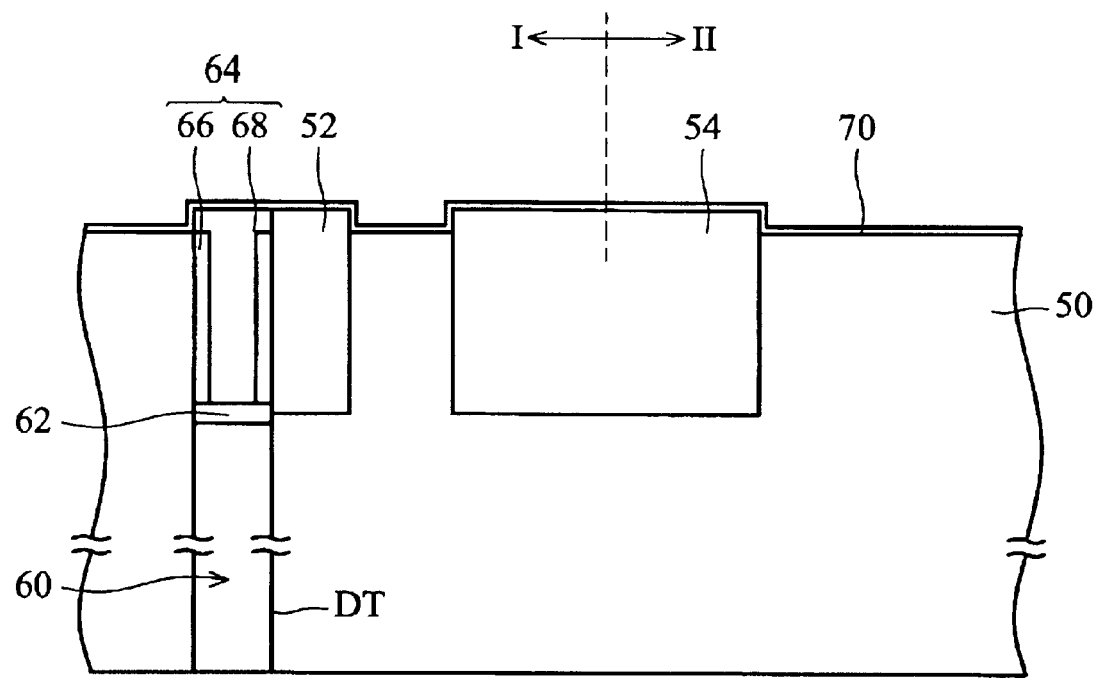

In FIG. 2B, the second pad layer 58 and the first pad layer 56 are removed to make the top surfaces of the gate electrode layer 68, the first STI structure 52 and the second STI structure 54 protrude from the exposed surface of the substrate 10. Then, a reoxidation process is employed to form a sacrificial oxide layer, and then an ion implantation process is performed on the support area II for adjusting device voltage, followed by removing the sacrificial oxide layer. Next, in FIG. 2C, thermal oxidation, chemical vapor deposition (CVD) or other enforceable processes may be used to form a gate dielectric layer 70 on the substrate 50. Preferably, the gate dielectric layer 70 is a silicon oxide layer.

Figure 2D:
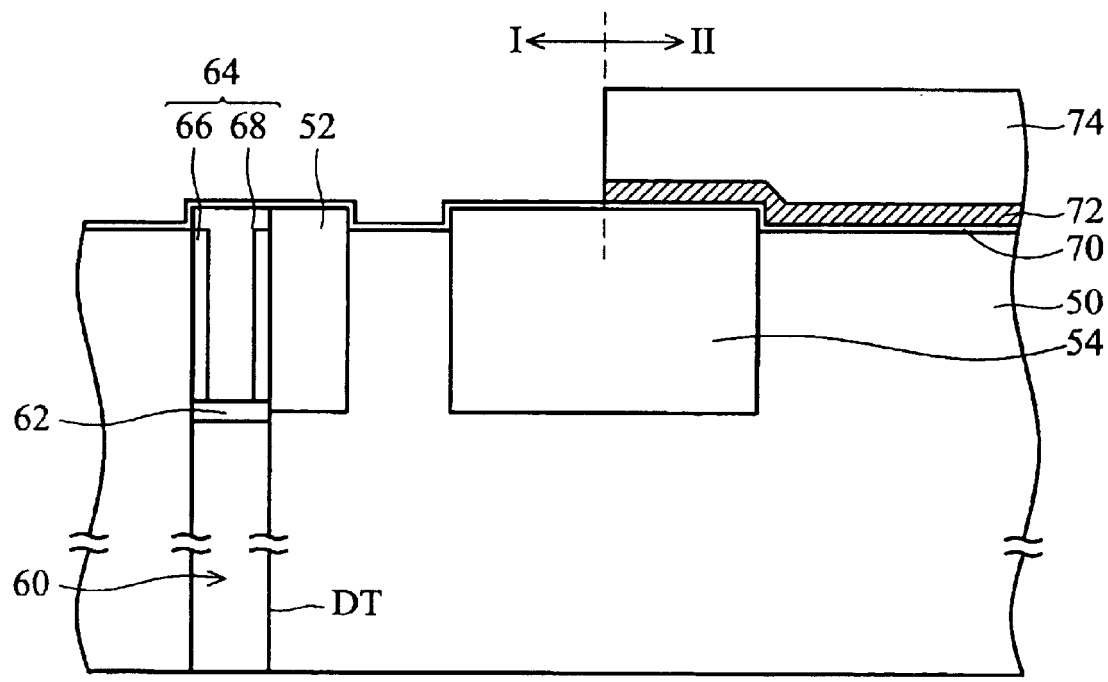

Next, in FIG. 2D, a first gate conductive layer 72, preferably a polysilicon layer of 600~800 Å in thickness, is deposited on the gate dielectric layer 70. Then, a first photoresist layer 74 with a predetermined pattern is employed as a mask to perform photolithography and etching, the first gate conductive layer 72 is removed from the array area I, thus the first gate conductive layer 72 remains on the gate dielectric layer 70 within the support area II.

Figure 2E:
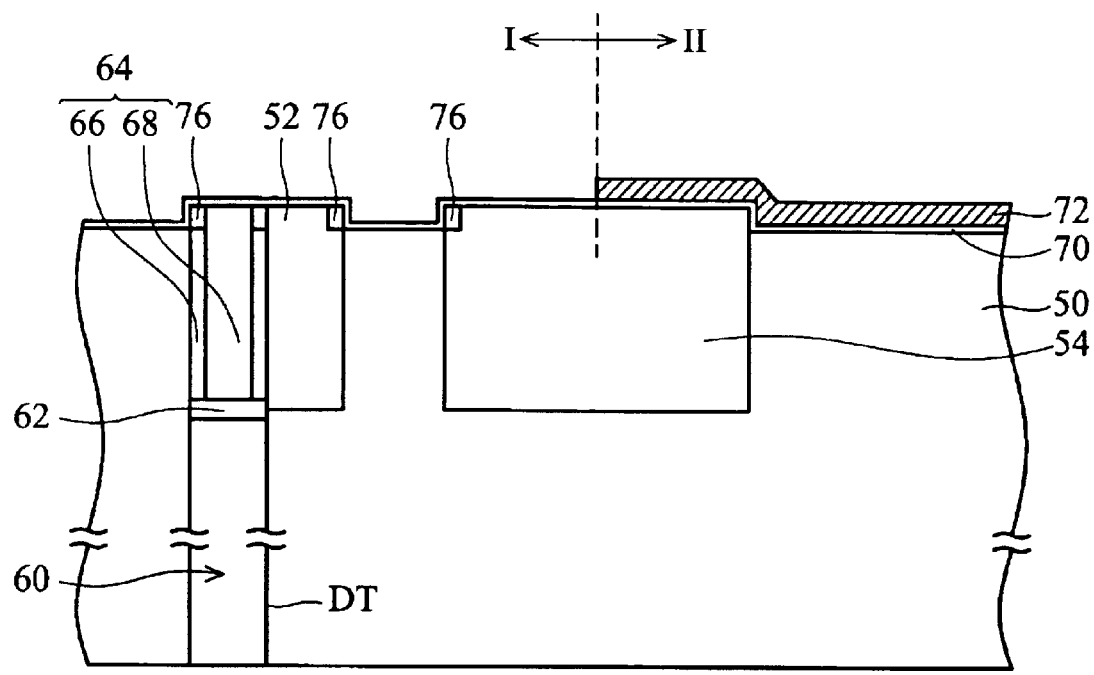

In FIG. 2E, deposition, photolithography and etching are used to form a spacer 76 on the top sidewalls of the gate electrode layer 68, the first STI structure 52 and the second STI structure 54. Preferably, the spacer 76 is a silicon nitride layer. The spacer 76 can repair the top defect of the gate electrode layer 68 because the top corner of the gate electrode layer 68 is susceptible to damage during removal of the second pad layer 58. Also, the spacer 76 can provide an isolation result to prevent current leakage from the vertical channel of the vertical transistor 64, thus ensuring electrical property thereof. Next, an ion implantation process for adjusting device voltage is performed on the array area I, and then the first photoresist layer 78 is removed.

Figure 2F:
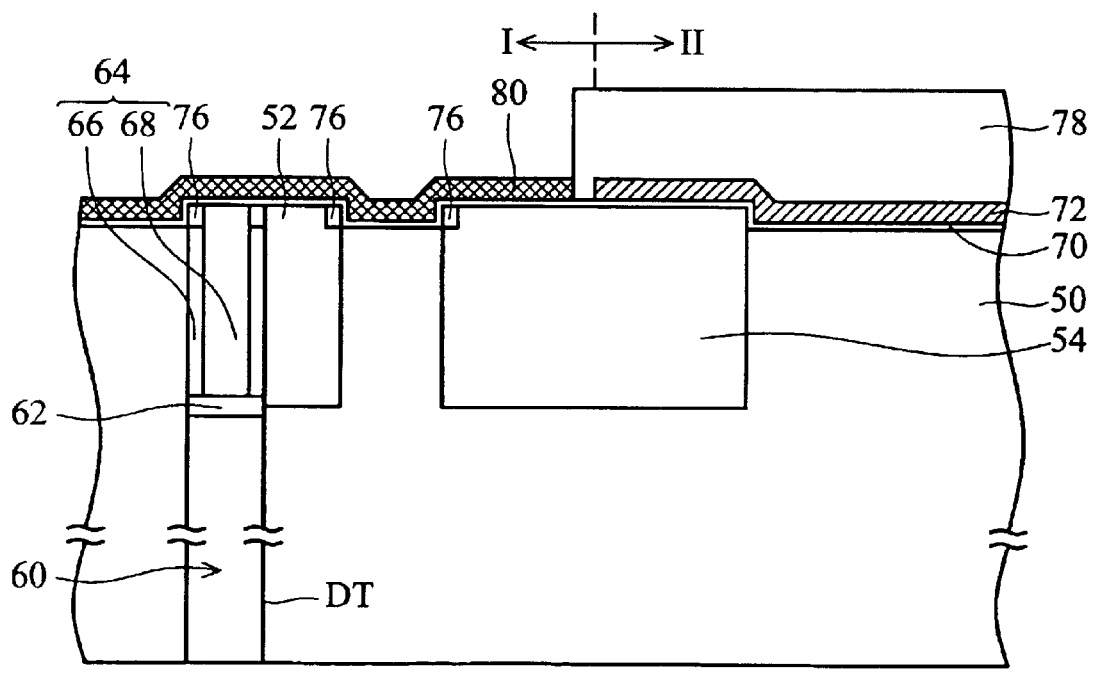

In FIG. 2F, a second photoresist layer 78 is provided to cover the exposed top and sidewall of the first gate conductive layer 78. Then, a liquid phase deposition (LPD) process is employed to selectively deposit a top isolating layer 80 outside the second photoresist layer 78, thus the top isolating layer 80 only exists on the array area I. Preferably, the top insulating layer 80 is a silicon oxide layer. The LPD process which is a low-pressure process with $H_2SiF_6$ as a reactive solution can selectively deposit a silicon oxide layer outside a photoresist material, thus omitting one photolithography step and simplifying the procedure.

Figure 2G:
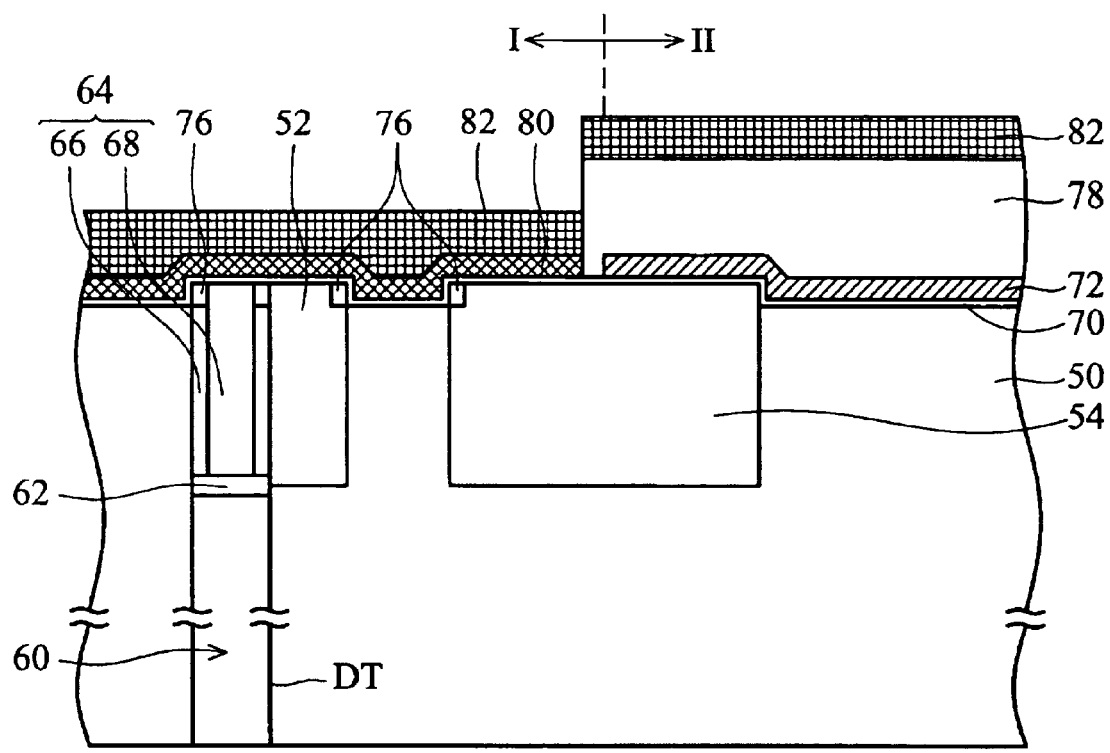
Figure 2H:
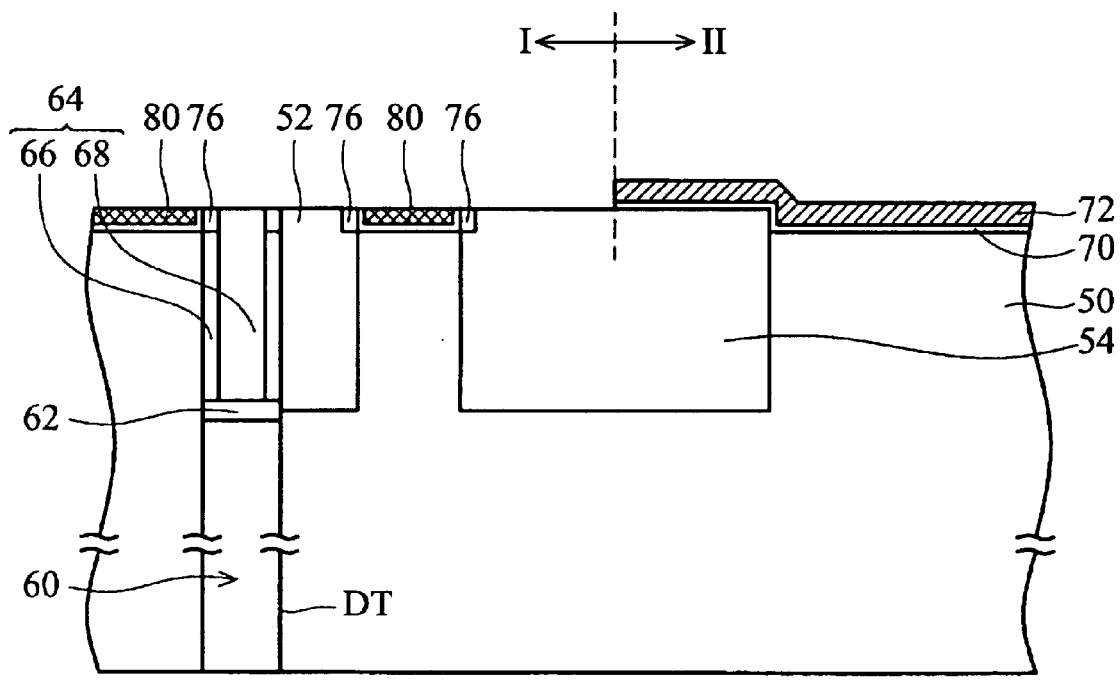
Figure 2I:
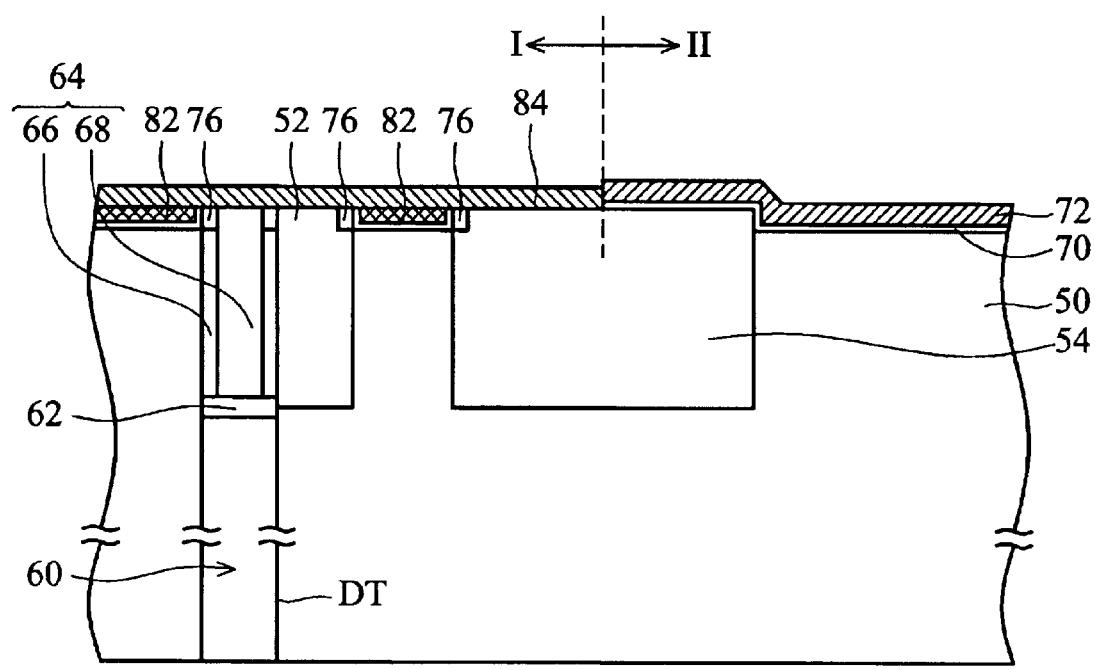

In FIG. 2G, an anti-reflective coating (ARC) layer 82 is formed on the top isolating layer 80 and the second photoresist layer 78 to fill the hollow portion until the array area I achieves a planarization result. Next, in FIG. 2H, a reactive ion etching (RIE) process is used to etch back the ARC layer 82 and remove the top isolating layer 80 until the top surfaces of the top isolating layer 80, the gate electrode layer 68 and the first STI structure 52 are leveled off. Then, the second photoresist layer 78 is removed. Finally, in FIG. 2I, a second gate conductive layer 84, preferably a polysilicon layer of 200~400 Å in thickness is formed on the array area I. Sequentially, in accordance with product designs and process requirements, two gate structures are defined on the array area I and the support area II, respectively, with the related processes omitted herein.

Accordingly, the fabrication method of the present invention has advantages described below. First, the LPD process cooperates with the coverage result of the second photoresist layer 78 and can selectively deposit the top isolating layer 80 on the array area I, thus omitting one photolithography step and simplify the procedure. Second, the top isolating layer 80 is selectively deposited on the array area I without covering the first gate conductive layer 72 on the support area II, thus decreasing the height difference of the surface profile and elevating subsequent process performance.

Third, the first pad layer 56 and the second pad layer 58 are removed from the array area I and the support area II at the same time, thereby eliminating several photoresist coating, photolithography and etching steps. This effectively lowers process difficulty and prevents top corner defects generated on the array area I. Fourth, compared with the conventional method, the present invention uses two patterned photoresist layers 74 and 78 to define the first gate conductive layer 72 and the top isolating layer 80, thus eliminating several photolithography and etching steps and reducing defects caused by pattern transferring steps. Fifth, before the formation of the top isolating layer 80, the spacer 76 is formed to repair the top defect of the gate electrode layer 68, thus providing an isolation result and preventing current leakage from the vertical channel of the vertical transistor 64.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for an array area and a support area of a DRAM cell, comprising the steps of:

providing a semiconductor silicon substrate which comprises an array area and a support area;

successively forming a first pad layer and a second pad layer overlying the semiconductor silicon substrate;

forming at least one deep trench in the semiconductor silicon substrate within the array area;

forming a vertical transistor overlying the upper portion of the deep trench, in which the vertical transistor comprises a gate electrode layer;

performing a planarization process to level off the gate electrode layer with the second pad layer;

removing the second pad layer and the first pad layer;

forming a gate, dielectric layer overlying the semiconductor silicon substrate;

forming a first gate conductive layer overlying the gate dielectric layer within the support area;

forming a photoresist layer overlying the support area to cover the top and sidewall of the first gate conductive layer;

performing a liquid phase deposition process to deposit a top isolating layer outside the photoresist layer, in which the top isolating layer is formed overlying the gate dielectric layer within the array area;

forming an anti-reflective coating layer on the top isolating layer and the photoresist layer;

performing an etching back process to remove parts of the anti-reflective coating layer and the top isolating layer until the top isolating layer is leveled with the gate electrode layer; and removing the photoresist layer.

2. The fabrication method for an array area and a support area of a DRAM cell of claim 1, wherein the semiconductor silicon substrate comprises:

at least a first shallow trench isolation structure formed within the array area to separate adjacent vertical transistors; and at lest a second shallow trench isolation structure formed in a transition region between the array area and the support area;

wherein, the planarization process levels off the top surfaces of the gate electrode layer, the second pad layer, the first shallow trench isolation structure and the second shallow trench isolation structure.

3. The fabrication method for, an array area and a support area of a DRAM cell of claim 2, wherein the first shallow trench isolation structure and the second shallow trench isolation structure are silicon oxide.

4. The fabrication method for an array area and a support area of a DRAM cell of claim 1, wherein the first pad layer is a silicon oxide layer.

5. The fabrication method for an array area and a support area of a DRAM cell of claim 1, wherein the second pad layer is a silicon nitride layer.

6. The fabrication method for an array area and a support area of a DRAM cell of claim 1, wherein the gate electrode layer is a polysilicon layer.

7. The fabrication method for an array area and a support area of a DRAM cell of claim 1, wherein the gate dielectric layer is a silicon oxide layer.

8. The fabrication method for an array area and a support area of a DRAM cell of claim 1, wherein the first gate conductive layer is a polysilicon layer.

9. The fabrication method for an array area and a support area of a DRAM cell of claim 1, further comprising the step of:

forming a spacer overlying the top sidewall of the gate electrode layer before performing the liquid phase deposition process.

10. The fabrication method for an array area and a support area of a DRAM cell of claim 9, wherein the spacer is a silicon nitride layer.

11. The fabrication method for an array area and a support area of a DRAM cell of claim 1, before forming the vertical transistor, further comprising the steps of:

forming a deep trench capacitor at the lower portion of the deep trench; and forming an isolating layer between the deep trench capacitor and the vertical transistor.

12. The fabrication method for an array area and a support area of a DRAM cell of claim 1, wherein the top isolating layer is a silicon oxide layer.

13. The fabrication method for an array area and a support area of a DRAM cell of claim 1, after removing the photoresist layer, further comprising the step of:

forming a second gate conductive layer on the array area.

* * * * *